United States Patent [19]

Harlizius

[11] Patent Number: 5,192,368
[45] Date of Patent: Mar. 9, 1993

[54] SCREEN PRINTING MACHINE PROVIDED WITH A COMPRESSED AIR CLEANER

[75] Inventor: Ralf Harlizius, Neuss, Fed. Rep. of Germany

[73] Assignee: Rheinmetall GmbH, Ratingen, Fed. Rep. of Germany

[21] Appl. No.: 830,905

[22] Filed: Jan. 30, 1992

[30] Foreign Application Priority Data

Feb. 28, 1991 [DE] Fed. Rep. of Germany ....... 4106330

[51] Int. Cl.$^5$ .............................................. B05C 11/00
[52] U.S. Cl. ...................................... 118/72; 118/213; 118/301; 118/676; 101/425; 15/309.2
[58] Field of Search ................. 118/72, 213, 301, 668, 118/676, 695; 101/425; 15/309.2, 405

[56] References Cited

U.S. PATENT DOCUMENTS

| | | | |
|---|---|---|---|
| 2,181,266 | 11/1939 | Durup | 101/425 |
| 2,708,417 | 5/1955 | Nieter | 118/213 |
| 3,086,882 | 4/1963 | Smith, Jr. et al. | 118/72 |
| 3,097,599 | 7/1963 | Rutishauser | 101/425 |

Primary Examiner—W. Gary Jones
Assistant Examiner—Todd J. Burns
Attorney, Agent, or Firm—Spencer, Frank & Schneider

[57] ABSTRACT

A screen printing machine for imprinting hybrid circuit boards with thick-film pastes of the type including a horizontally movable printing table (12) and a vertically raisable frame (16), wherein a compressed air cleaner (2) is attached to the frontal or end surface (18) of the frame (16). This compressed air cleaner (22) is actuated by means of switches (28, 30), preferably proximity switches, as a function of the side to side movement of the printing table (12) and thus permits an automatized cleaning process for the hybrid circuit board (14).

7 Claims, 2 Drawing Sheets

SCREEN PRINTING MACHINE PROVIDED WITH A COMPRESSED AIR CLEANER

REFERENCE TO RELATED APPLICATIONS

This application claims the priority of Federal Republic of Germany application Serial No. P 41 06 330.9 filed Feb. 28, 1991, which is incorporated herein by reference.

BACKGROUND OF THE INVENTION

The present invention relates to a screen printing machine for the production of printed hybrid circuit boards. More particularly, the present invention relates to a screen printing machine, a basic support housing, a printing table, having an upper surface portion for a circuit board to be printed, mounted on the support housing for horizontal movement along a path between a first position for receiving a circuit board to be printed and a second printing position, and a vertically raising frame member attached to the support housing and extending above the path of movement of the printing table.

Such screen printing machines are known to be employed to imprint hybrid printed circuit boards with thick-film pastes, with the printed-on pastes subsequently being burnt in or fired on the circuit board in a kiln. In this well-known prior art process, the circuit boards have in the past been cleaned of dust or other adhering particles before each printing process by being subjected to manually applied compressed air, for example, by air pistols.

The drawback in this manual cleaning process is that, because of the pointed orientation of the stream of compressed air, a cleaning process by means of air pistols is actually not very effective. If, nevertheless, the desired degree of cleanliness is to be attained, considerable expenditures in time are required which again are cost intensive because of the personnel required to accomplish this cleaning process.

SUMMARY OF THE INVENTION

It is therefore an object of the present invention to provide a screen printing machine of the above type for the production of hybrid printed circuit boards which operates with an integrated automatic compressed air cleaning apparatus. In addition, the resulting cleaning process is distinguished by high efficiency at low cost.

The above object is achieved according to the present invention by a screen printing machine for the production of printed hybrid circuit boards, which machine includes: a basic support housing; a printing table, having an upper surface portion for a circuit board to be printed, mounted on a the support housing for horizontal movement along a path between a first position, wherein a circuit board to be printed can be placed on said upper surface of said printing table, and a second printing position; a vertically raising frame member attached to the support housing and extending above the path of movement of said printing table; compressed air cleaning means, connected to a compressed air conduit containing a controllable valve and mechanically fastened to an end surface of the frame member above the path of movement of the printing table, for directing compressed air onto the circuit board containing portion of the upper surface of said printing table during movement of the printing table along the path of movement; and an electrical switching means, disposed on the printing table and on the basic support housing and responsive to the position of the printing table along the path of movement, for controlling the actuation and deactuation of the control valve to control the flow of compressed air to the compressed air cleaning means.

With the application, according to the invention, of a compressed air cleaning device to the frontal or end surface of the vertical frame of the screen printing machine, which compressed air cleaning devices acts over the surface of the material being printed in conjunction with the switching device provided to control the supply of compressed air, it is possible to realize direct efficient cleaning of the hybrid printed circuit board before the board is imprinted.

An advantageous feature of the invention is a nozzle which is rotatably arranged within the compressed air cleaning device. Such a nozzle permits accurate control and orientation of the desired uniform flow of air against the circuit board so that it is ensured, in every case, that all particles blown off the circuit board are unable to enter the screen printing machine or reach the underside of the removed frame.

The invention will be explained and described below with reference to the drawings.

DETAILED DESCRIPTION OF THE PREFERRED EMBODIMENT

Figure 1:
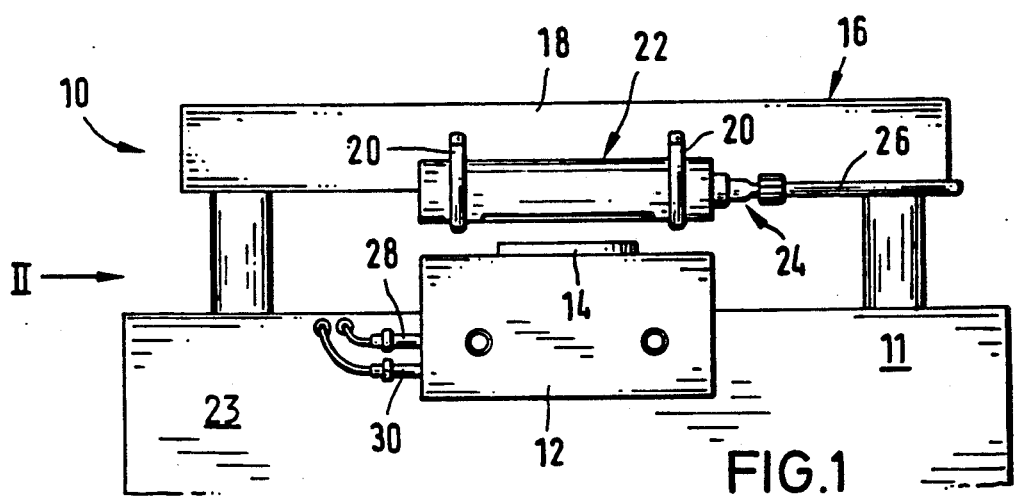
FIG. 1 is a schematic representation in a frontal view of the screen printing machine according to the invention.

FIG. 1 shows a known screen printing machine 10 composed of a basic support housing 11, an extendable printing table 12 mounted in the support housing 11 and with the material to be printed, here a hybrid circuit 14, disposed on an upper surface of the table 12, and a frame 16 that rises vertically out of the basic housing 11.

Figure 2:
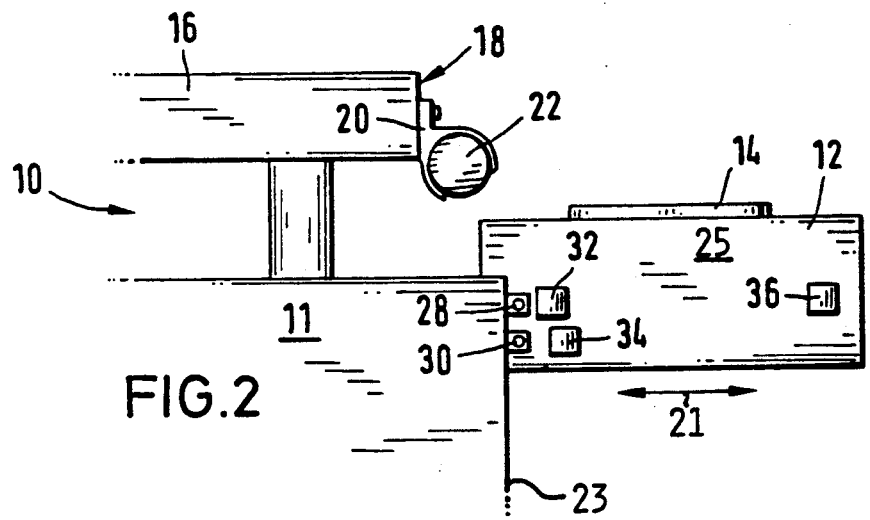
FIG. 2 is a schematic representation in a side view of the screen printing machine of FIG. 1 seen from the direction of the arrow II in FIG. 1.

The printing table 12 is mounted in the housing 11 for horizontal movement, in the directions of the double arrow 21 of FIG. 2, between the illustrated position wherein the table 12 extends laterally outside of the housing 11 beyond its vertical end surface 23 to enable a new object to be printed, e.g., board 14, to be placed on the upper surface of table 12, and a printing position wherein the table 12 is within the support housing 11.

Preferably two holding brackets 20 (see also FIG. 2) are releasably attached, for example, by means of screws, to the frontal or end surface 18 of the frame 16. These holding brackets 20 serve to accommodate and fasten a horizontally oriented compressed air cleaner 22 to the frontal surface 18 of frame 16 in the region of printing table 12 which, as indicated above, moves horizontally from side to side as indicated by the double arrow 21.

Via a conventional compressed air port 24, compressed air cleaner 22 is connected with a compressed air conduit 26 and can thus be charged with compressed air. Any desired, known device can be employed to generate the compressed air, and for the sake of simplicity is not shown.

Next to extendable printing table 12, an upper switch 28 and a lower switch 30, preferably commercially available proximity switches, for example, inductive proximity switches, are attached to the frontal or end surface 23 of the basic housing 11 and are connected with an electronic control circuit.

FIG. 2 shows the screen printing machine 10 from the side, approximately from the direction of an arrow II shown in FIG. 1. In addition to the features already mentioned in the description of FIG. 1, which bear the same reference numerals here, FIG. 2 shows small metal plates 32, 34, 36, preferably of an iron-containing material, which are applied on the vertical side surface 25 of the printing table 12 to serve as actuators for the proximity switches 28 and 30.

The plate 32 and the plate 36 are disposed at the height of the upper proximity switch 28. These plates 32 and 36 are arranged in a manner such that horizonal side to side movement of the printing table 12, as indicated by the double arrow 21 below printing table 12, enables these plates 32 and 36 to come into congruence with the upper proximity switch 30 and to trip or actuate same. The metal plate 34 is disposed at the height of the lower proximity switch 30 for actuating the switch 30 upon movement of the table 12, and is positioned adjacent to the plate 32 but slightly closer laterally to the plate 36.

Figure 3A:
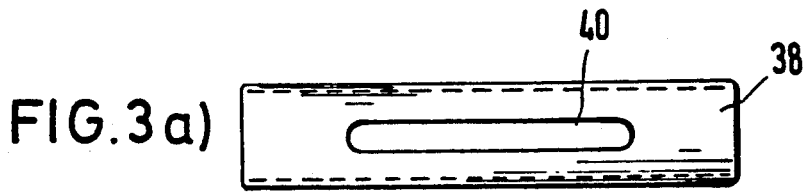
FIG. 3a is an enlarged view of an external tube of the compressed air cleaning device according to the present invention for the screen printing machine of FIG. 1.
Figure 3B:
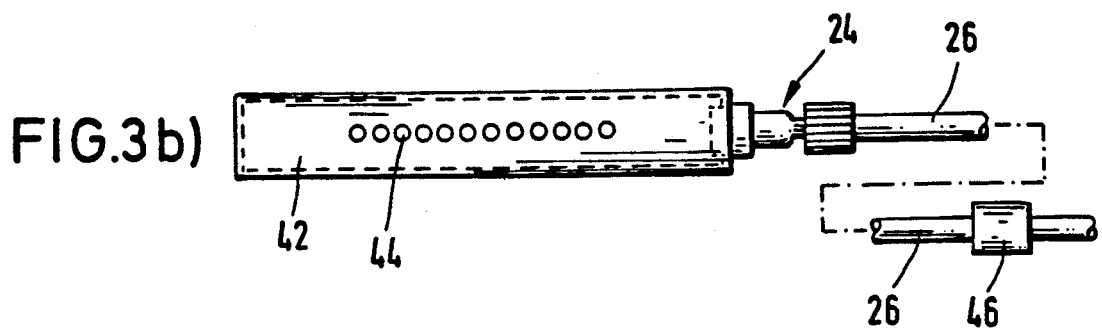
FIG. 3b is a view, approximately to the same scale as FIG. 3a, of the compressed air cleaner nozzle according to the invention as shown in FIG. 1.

As shown in FIGS. 3a and 3b, the actual compressed air cleaner 22 is composed of an exterior tube 38 open at both ends and which, as shown in FIG. 3a, is provided with an elongated hole or slot 40 extending in the direction of the longitudinal axis of the tube 38. A nozzle 42 which in turn is composed of a tube, preferably of brass, that is closed on one end, has its other end connected to the compressed air port 24, and is provided with a plurality of mutually aligned holes 40 extending in the direction of its longitudinal axis, is rotatably supported in the exterior tube 38. Nozzle 42 is placed in exterior tube 38 in a manner such that the elongated hole 40 in exterior tube 38 exposes the holes 44 in nozzle 42. Thus the compressed air coming into nozzle 42 (see also FIG. 1) through the compressed air port 24 is able to exit through holes 44.

An electromagnetic valve 46 (see FIG. 3b) is provided in the compressed air conduit 26 to turn the compressed air supplied to the nozzle 42 on and off. Preferably, a conventional choke valve and a likewise conventional, and preferably microfine, filter are provided in the compressed air conduit 26, but are not shown for the sake of simplicity.

The mode of operation of the compressed air cleaning process employing the compressed air cleaner according to the invention in dependence on the movement of printing table 12 is simple and will now be described briefly.

As soon as printing table 12 starts to move from the illustrated position toward the printing position for a printing process, i.e., toward the left in FIG. 2, the upper proximity switch 28 is tripped by the iron plate 32, thus in turn releasing or opening the electromagnetic valve 46 in compressed air conduit 26 so that compressed air is able to escape through holes 44 in nozzle 42, and dirt particles are blown away from the material to be printed i.e., the board 14.

When printing table 12 has entered almost completely into basic support housing 11 so that the printing position has almost been reached, the upper proximity switch 28 is actuated again by the iron plate 36, causing valve 46 to be closed and the compressed air supply to be turned off. At the same time, via a known electronic control system, the upper proximity switch 28 is locked to prevent it from switching the electromagnetic compressed air valve 46 on again i.e., to the open position. When printing table 12 is moved out again to the position illustrated in FIG. 2 upon completion of the printing process, the lower proximity switch 30 is actuated via the plate 34 shortly before the printing table 12 reaches its starting position, thus releasing the lock on the upper proximity switch 28. Thus, the upper proximity switch 28 is enabled and is able to turn the compressed air supply on again via valve 46 as already described for a new printing process.

Preferably, nozzle 42 in exterior tube 38 should be set during the movement of printing table 12 so that the compressed air exiting through holes 44 flows against the material 14 to be printed at an outwardly oriented angle of about 60°. It has been found that this is the angle for optimum cleaning. In view of the desire to have the dirt particles blow uniformly away from the material 14 being printed, the number of holes 44 and the thus determined longitudinal extent of elongated hole or slot 40 should be selected so that the width of the air nozzle defined thereby is greater than the maximum width of the portion of the upper surface of table 12 used for the mounting of articles to be printed.

Figure 4:
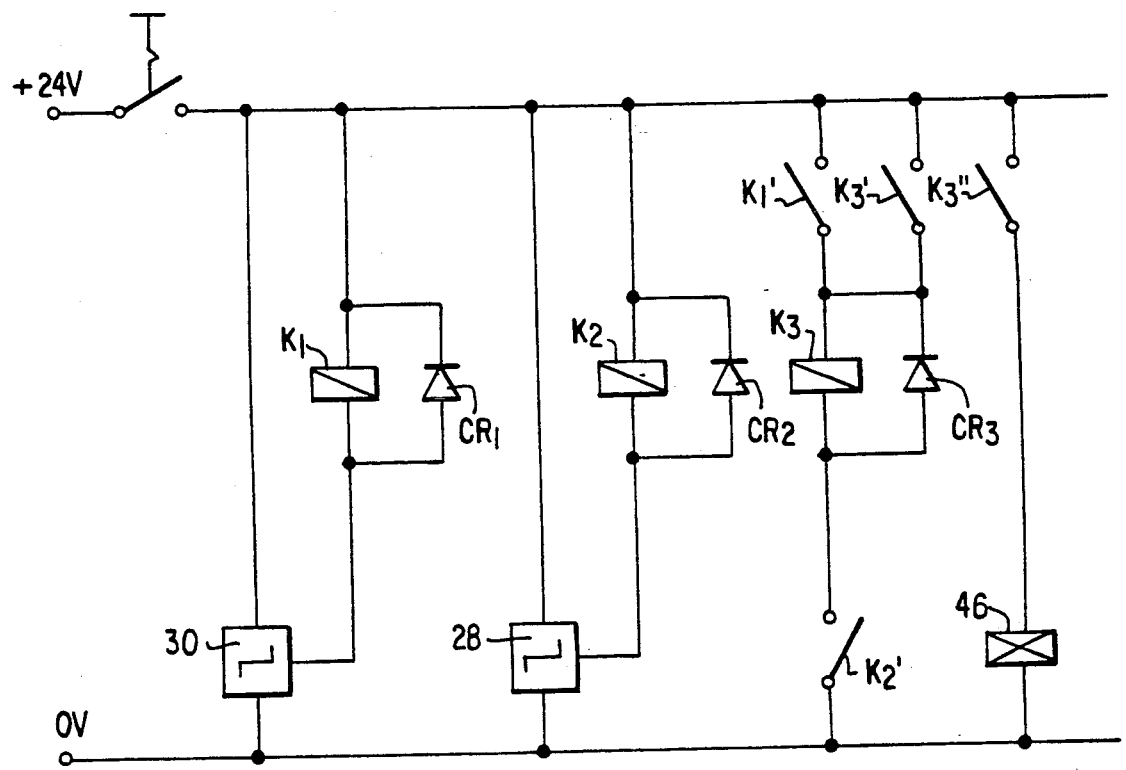
FIG. 4 shows the electronic switching unit which initiates the stream of cleaning air as a function of the direction of movement and position of the printing table.

Turning now to FIG. 4, there is shown an electronic switching circuit which initiates the stream of cleaning air as a function of the direction of movement and position of the printing table 12. The circuit essentially comprises three relays K1, K2 and K3, each of which has a respective diode CR1, CR2 and CR3 connected across its coil, and with relays K1 and K2 being directly controlled by the proximity switches 30 and 28, respectively. The proximity switches 28 and 30 switch the control input without voltage toward 0V when the switches come in contact with the associated or iron plates 32, 34 or 36. The circuit of FIG. 4 operates as follows:

With the table 12 in the normal starting position, as shown in FIG. 2, upon initiation of the printing process, the table 12 begins to move inwardly. This causes plate 32 to activate proximity switch 28, causing relay K2 to respond and open its normally closed contact K2' which, in turn, blocks activation of relay K3. The further movement of the table 12 causes plate 34 to activate switch 30, which causes relay K1 to respond and close its normally open contact K1'. At this time relay K2 is still activated so that relay K2 cannot respond. After a short travel path of the table 12, plate 32 no longer activates switch 28, so that relay K2 drops, closing contact K2' and releasing relay K3 which then responds and holds itself via its closed contact K3'. Together with the turn-on or activation of relay K3, magnetic compressed air valve 46 is switched on via closed contact K3" and nozzle 42 is charged with compressed air. Shortly before the printing table 12 reaches the printing position, proximity switch 28 is activated by plate 36. This causes rely K2 to respond and open contacts K2', which in turn results in relay K3 being deactivated and compressed via valve 46 being switched off. The stream of air is interrupted and then the actual printing process takes place.

Upon completion of the printing process, table 12 automatically moves out toward the position shown in FIG. 2. Plate 36 activates proximity switch 28 which causes relay K2 to respond, without effect, however. Shortly before the printing table 12 moves into the starting position, proximity switch 30 is activated by plate 34. This causes relays K1 and K3 to respond and compressed air valve 46 to be switched on. However, a soon as proximity switch 28 is activated by plate 32, relay K2 responds to deactivate relay K3 and thus turn compressed air valve 46 off again. The printing table 12 is now in the starting position (FIG. 2). The brief activation of the compressed air valve 46 during this return travel has no negative influence on the still liquid thick-film paste since the printed material is already disposed outside of the effective range of the stream of compressed air.

The system is ready for the next printing job.

The invention now being fully described, it will be apparent to one of ordinary skill in the art that any changes and modifications can be made thereto without departing from the spirit or scope of the invention as set forth herein.

I claim:

1. A screen printing machine for the production of printed hybrid circuit boards, comprising a basic support housing; a printing table having an upper surface portion for a circuit board to be printed, said printing table mounted on said support housing for horizontal movement along a path between a first position, wherein a circuit board to be printed can be placed on said upper surface of said printing table, and a second printing position; a vertically raising frame member attached to said support housing and extending above said path of movement of said print table; compressed air cleaning means, which are connected to a compressed air conduit containing a controllable valve and are mechanically fastened to an end surface of said frame member above said path of movement of said printing table, for directing compressed air onto said portion of said upper surface of said printing table during movement of said printing table along said path of movement; and, an electrical switching means, disposed on said printing table and on said basic support housing and responsive to the position of said printing table along said path of movement, for controlling the actuation and deactuation of said control valve to control the flow of said compressed air to said compressed air cleaning means.

2. A screen printing machine as defined in claim 1, wherein: said compressed air cleaning means includes a nozzle composed of a tube which is closed at one end, which has its oppositely disposed end provided with a compressed air port connected to said conduit, and which has a plurality of radial holes that are aligned with one another along a longitudinal axial direction of said tube; and said tube is fastened to said end surface of said frame with its said longitudinal axial direction extending transverse to said path of movement of said printing table.

3. A screen printing machine as defined in claim 2 wherein said compressed air cleaning means further includes:

an exterior tube completely enclosing said nozzle over its longitudinal extent, with said nozzle being rotatable within said exterior tube;

an elongated hole in said exterior tube and extending along said longitudinal axial direction, with said elongated hole being aligned with said radial holes in said tube of said nozzle by rotation of said nozzle within said exterior tube; and at least one bracket for fastening said exterior tube to said end surface of said frame member.

4. A screen printing machine as defined in claim wherein said electrical switching means includes a first switch arranged on said basic support housing in the region of said printing table, and at least first and second switch actuators disposed on said printing table at spaced positions in said direction of movement of said printing table and cooperating with said first switch for the controlled actuation of said first switch.

5. A screen printing machine as defined in claim 4 wherein: said printing table is mounted in said basic support housing so that it extends laterally beyond a vertical end surface of said support housing when in said first position; said first switch is a proximity switch mounted on said end surface of said support housing; and said first and second switch actuators are respective first and second metal plates mounted on a vertical side surface of said printing table.

6. A screen printing machine as defined in claim 5 wherein said electrical switching means further includes a second proximity switch mounted on said end surface of said support housing adjacent said printing table and vertically spaced from said first switch, and a third switch actuator in the form of a third metal plate mounted on said side surface of said printing table for cooperation with said second proximity switch during movement of said printing table.

7. A screen printing machine as defined in claim 6 wherein: said first and second metal plates are disposed on said side surface of said printing table to actuate said first switch upon initiation of movement of said table from said first to said second position, and shortly before said printing table reaches said second position, respectively; and said third metal plate for actuating said second switch is disposed on said side surface of said printing table to be vertically spaced from said first and second metal plates, adjacent said first metal plate, and laterally displaced from said first metal plate in a direction toward said second metal plate.

* * * * *